US012610603B2

(12) United States Patent
Uehara et al.

(10) Patent No.: US 12,610,603 B2
(45) Date of Patent: Apr. 21, 2026

(54) SILICON CARBIDE SEMICONDUCTOR DEVICE, INVERTER CIRCUIT USING THE SAME, AND METHOD FOR MANUFACTURING SILICON CARBIDE SEMICONDUCTOR DEVICE

(71) Applicant: DENSO CORPORATION, Kariya-city (JP)

(72) Inventors: Junichi Uehara, Kariya-city (JP); Yusuke Hayama, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 364 days.

(21) Appl. No.: 18/366,002

(22) Filed: Aug. 7, 2023

(65) Prior Publication Data

US 2023/0378292 A1 Nov. 23, 2023

Related U.S. Application Data

(63) Continuation of application No. PCT/JP2022/013713, filed on Mar. 23, 2022.

(30) Foreign Application Priority Data

Mar. 24, 2021 (JP) ................................. 2021-049875
Mar. 22, 2022 (JP) ................................. 2022-045676

(51) Int. Cl.
*H10D 64/27* (2025.01)
*H10D 30/01* (2025.01)
(Continued)

(52) U.S. Cl.
CPC ......... *H10D 64/513* (2025.01); *H10D 30/051* (2025.01); *H10D 30/615* (2025.01); *H10D 62/8325* (2025.01)

(58) Field of Classification Search
CPC ......................... H10D 64/513; H10D 62/8325
See application file for complete search history.

(56) References Cited

U.S. PATENT DOCUMENTS

| 2018/0114856 A1 | 4/2018 | Nakano |
| 2018/0233563 A1 | 8/2018 | Hiyoshi et al. |

(Continued)

FOREIGN PATENT DOCUMENTS

| JP | 2018-064022 A | 4/2018 |
| JP | 2018-129486 A | 8/2018 |

*Primary Examiner* — Wasiul Haider
(74) *Attorney, Agent, or Firm* — Posz Law Group, PLC

(57) ABSTRACT

A SiC semiconductor device includes a substrate of a first conductivity type, a buffer layer of the first conductivity type on the substrate, a low-concentration layer on the buffer layer, a first deep layer and a JFET portion on the low-concentration layer, a current diffusion layer of the first conductivity type disposed on the JFET portion and having an impurity concentration higher than the low-concentration layer, a second deep layer of a second conductivity type disposed on the first deep layer, a base layer of the second conductivity type disposed on the current diffusion layer and the second deep layer, an impurity region of the first conductivity type disposed in a surface layer portion of the base layer, and a trench gate structure penetrating the impurity region and the base layer and reach the current diffusion layer. The JFET portion is formed with defect portions.

18 Claims, 12 Drawing Sheets

(51) Int. Cl.
    *H10D 30/60*         (2025.01)
    *H10D 62/832*      (2025.01)

(56)         References Cited

U.S. PATENT DOCUMENTS

| | | |
|---|---|---|
| 2019/0019680 A1* | 1/2019 | Takeuchi .............. H01L 21/266 |
| 2019/0027598 A1* | 1/2019 | Oyama .............. H10D 30/6739 |
| 2019/0189756 A1 | 6/2019 | Okumura |
| 2019/0198619 A1 | 6/2019 | Iijima et al. |
| 2019/0237577 A1 | 8/2019 | Okamoto et al. |
| 2019/0378922 A1 | 12/2019 | Nakano |
| 2020/0161467 A1 | 5/2020 | Takeuchi et al. |
| 2021/0234040 A1 | 7/2021 | Nakano |
| 2023/0077367 A1 | 3/2023 | Okamoto et al. |

* cited by examiner

FIG. 17A
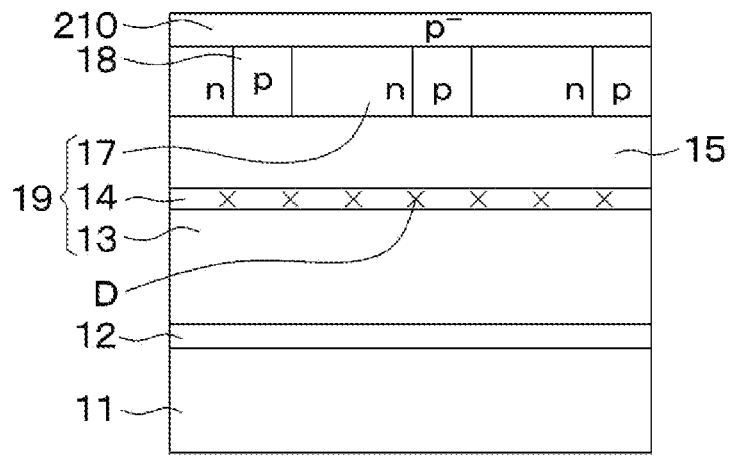
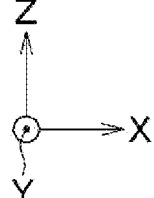
FIG. 17B
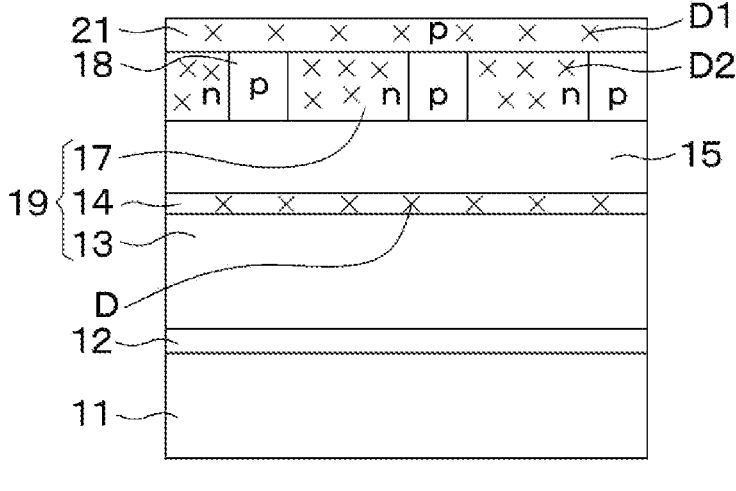
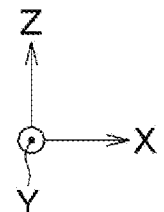

SILICON CARBIDE SEMICONDUCTOR DEVICE, INVERTER CIRCUIT USING THE SAME, AND METHOD FOR MANUFACTURING SILICON CARBIDE SEMICONDUCTOR DEVICE

CROSS-REFERENCE TO RELATED APPLICATIONS

The present application is a continuation application of International Patent Application No. PCT/JP2022/013713 filed on Mar. 23, 2022, which designated the U.S. and claims the benefit of priority from Japanese Patent Application No. 2021-049875 filed on Mar. 24, 2021 and Japanese Patent Application No. 2022-045676 filed on Mar. 22, 2022. The entire disclosures of all of the above applications are incorporated herein by reference.

TECHNICAL FIELD

The present disclosure relates to a silicon carbide (hereinafter, also simply referred to as SiC) semiconductor device having a trench gate structure, an inverter circuit using the SiC semiconductor device, and a method for manufacturing the SiC semiconductor device.

BACKGROUND

For example, a SiC semiconductor device, in which a metal oxide semiconductor field effect transistor (MOSFET) having a trench gate structure is formed, has been proposed. In such a SiC semiconductor device, an $n^-$-type buffer layer having an impurity concentration lower than an $n^+$-type substrate is formed on the substrate, and a low-concentration layer having an impurity concentration lower than the buffer layer is formed on the buffer layer. A p-type first deep layer and an n-type JFET portion, which are extended in one direction as a longitudinal direction, are formed on the low-concentration layer. Further, the first deep layers and the JFET portions are alternately disposed along a direction in which the first deep layers and the JFET portions intersect with the longitudinal direction, so that the JFET portion is disposed between the adjacent first deep layers.

An n-type current diffusion layer and a p-type second deep layer are disposed on the first deep layers and the JFET portions. A p-type base layer is disposed on the current diffusion layer and the second deep layer. The second deep layer is disposed to connect the first deep layer and the base layer.

An $n^+$-type source region is formed in a surface layer portion of the base layer. A plurality of trenches are formed to penetrate the source region and the base layer and reach the current diffusion layer, and a gate insulating film and a gate electrode are sequentially formed in each trench. As a result, the trench gate structure is formed.

SUMMARY

The present disclosure describes a SiC semiconductor device, an inverter circuit having the SiC semiconductor device, and a method for manufacturing the SiC semiconductor device. In an aspect of the present disclosure, a SiC semiconductor device includes a cell section formed with a switching element, and an outer peripheral section surrounding the cell section. The cell section includes: a substrate of a first conductivity type made of SiC; a buffer layer of the first conductivity type formed on the substrate and having an impurity concentration lower than the substrate; a low-concentration layer of the first conductivity type formed on the buffer layer and having an impurity concentration lower than the substrate; a first deep layer of a second conductivity type formed on the low-concentration layer and having a plurality of linear portions whose longitudinal directions are one direction along a planar direction of the substrate; a JFET portion of the first conductivity type disposed on the low-concentration layer and having a linear portion sandwiched between the linear portions of the first deep layer; a current diffusion layer of the first conductivity type disposed on the JFET portion and having an impurity concentration higher than the low-concentration layer; a second deep layer of the second conductivity type disposed on the first deep layer; a base layer of the second conductivity type disposed on the current diffusion layer and the second deep layer; an impurity region of the first conductivity type formed in a surface layer portion of the base layer; a trench gate structure having a gate insulating film formed on a wall surface of a trench that penetrates the impurity region and the base layer to reach the current diffusion layer, and a gate electrode formed on the gate insulating film; a first electrode electrically connected to the impurity region and the base layer; and a second electrode electrically connected to the substrate. Further, the JFET portion is formed with defect portions.

BRIEF DESCRIPTION OF DRAWINGS

FIG. 17A is a cross-sectional view illustrating a manufacturing step of the SiC semiconductor device according to the third embodiment.

FIG. 17B is a cross-sectional view illustrating a manufacturing step of the SiC semiconductor device that follows FIG. 17A.

DETAILED DESCRIPTION

Figure 1:
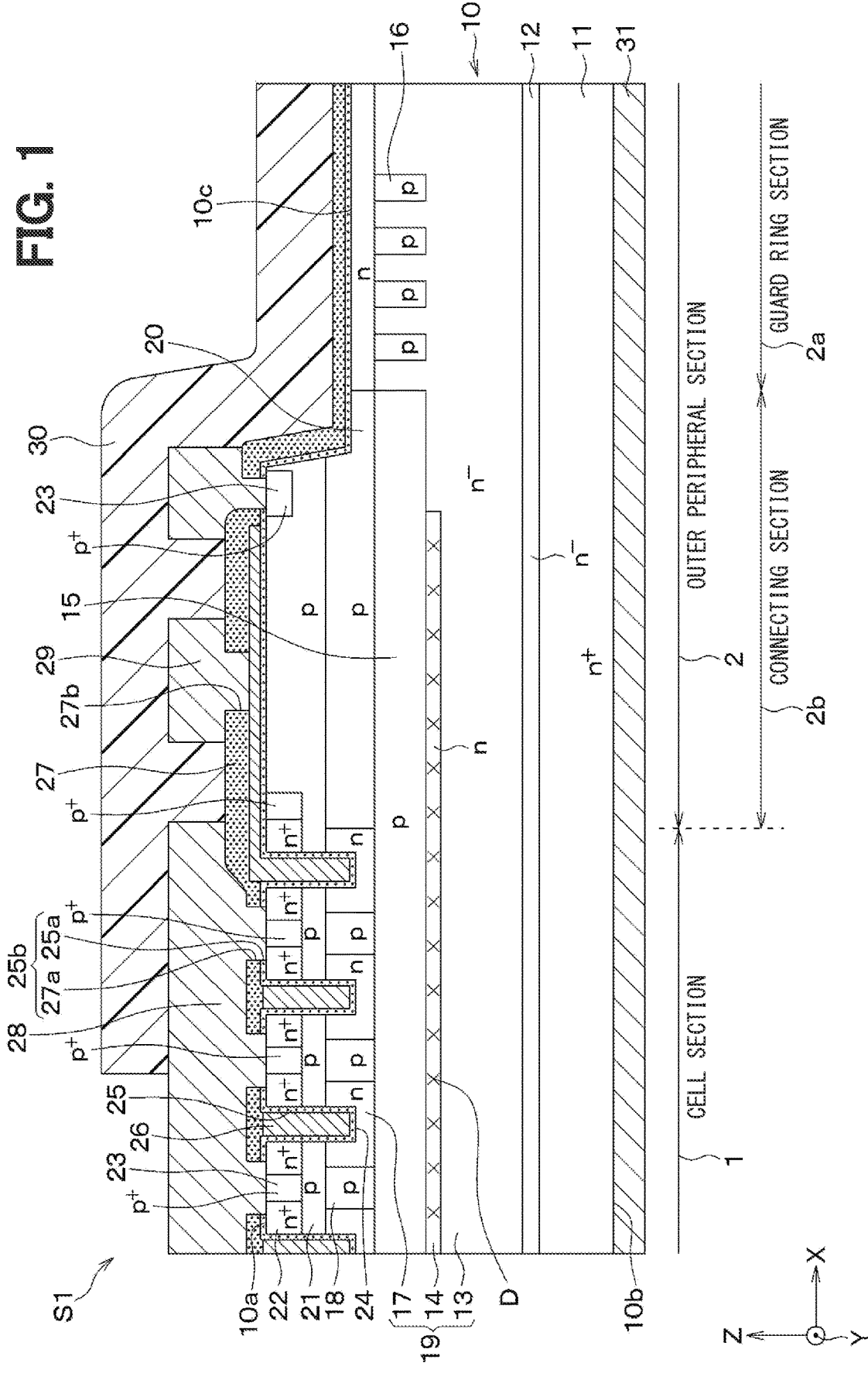
FIG. 1 is a cross-sectional view of a SiC semiconductor device according to a first embodiment.

In a proposed SiC semiconductor device as described above, a parasitic diode is formed by a p-n junction between the base layer and the like and the current diffusion layer and the like. Therefore, it is conceivable that such a SiC semiconductor device utilizes the parasitic diode at the time of reverse conduction.

In a SiC semiconductor device, in a case where basal plane dislocation (i.e., basal plane location: hereinafter, also simply referred to as BPD) exists in the substrate, holes implanted at the time of reverse conduction may reach the basal plane dislocation, and thus the basal plane dislocation can expand to stacking fault (hereinafter, also simply referred to as SF). In such a case, the BPD has a small influence on an element operation because it is a linear defect, but the SF has a large influence on an element operation because it is a planar defect. Therefore, in the SiC semiconductor device as described above, an on-voltage may increase.

The present disclosure provides a SiC semiconductor device capable of suppressing an increase in an on-voltage, an inverter circuit using the SiC semiconductor device, and a method for manufacturing the SiC semiconductor device.

According to an aspect of the present disclosure, a SiC semiconductor device includes: a cell section in which a switching element is formed; and an outer peripheral section surrounding the cell section, in which the cell section includes: a substrate of a first conductivity type made of SiC; a buffer layer of the first conductivity type formed on the substrate and designed to have an impurity concentration lower than the substrate; a low-concentration layer of the first conductivity type formed on the buffer layer and designed to have an impurity concentration lower than the substrate; a first deep layer of a second conductivity type formed on the low-concentration layer and having a plurality of linear portions whose longitudinal directions are one direction in a planar direction of the substrate; a JFET portion of the first conductivity type disposed on the low-concentration layer and having a linear portion sandwiched between the linear portions of the first deep layer; a current diffusion layer of the first conductivity type disposed on the JFET portion and designed to have an impurity concentration higher than the low-concentration layer; a second deep layer of the second conductivity type disposed on the first deep layer; a base layer of the second conductivity type disposed on the current diffusion layer and the second deep layer; an impurity region of the first conductivity type formed in a surface layer portion of the base layer; a trench gate structure having a gate insulating film formed on a wall surface of a trench that penetrates the impurity region and the base layer to reach the current diffusion layer, and a gate electrode formed on the gate insulating film; a first electrode electrically connected to the impurity region and the base layer; and a second electrode electrically connected to the substrate. The JFET portion is formed with defect portions.

According to this, it is possible at the time of reverse conduction of the SiC semiconductor device to suppress carriers (e.g., holes) from reaching the BPD because the carriers are trapped by the defect portions. Therefore, it is possible to suppress the BPD from expanding to the SF, and it is possible to suppress an increase in the on-voltage.

According to another aspect of the present disclosure, an inverter circuit, having an arm in which a MOSFET and a freewheeling diode are connected in parallel, includes the SiC semiconductor device, in which the MOSFET is formed by a switching element, and the freewheeling diode is formed by a parasitic diode formed in the switching element.

According to this, a parasitic diode formed in the SiC semiconductor device is used as the freewheeling diode included in the inverter circuit. Therefore, it is not necessary to prepare a separate member that forms the freewheeling diode separately from the MOSFET, and the configuration can be simplified.

According to another aspect of the present disclosure, a method for manufacturing the above-described SiC semiconductor device includes: disposing the low-concentration layer as an epitaxial layer; forming the JFET portion by performing ion implantation on a surface layer portion of the low-concentration layer; and forming the defect portions in the JFET portion by performing the ion implantation.

According to this, it is possible to easily manufacture a SiC semiconductor device in which defect portions that trap carriers (e.g., holes) at the time of reverse conduction are formed.

Hereinafter, embodiments of the present disclosure will be described with reference to the drawings. In the following embodiments, the same or equivalent portions will be denoted by the same reference numerals and described.

First Embodiment

Figure 2:
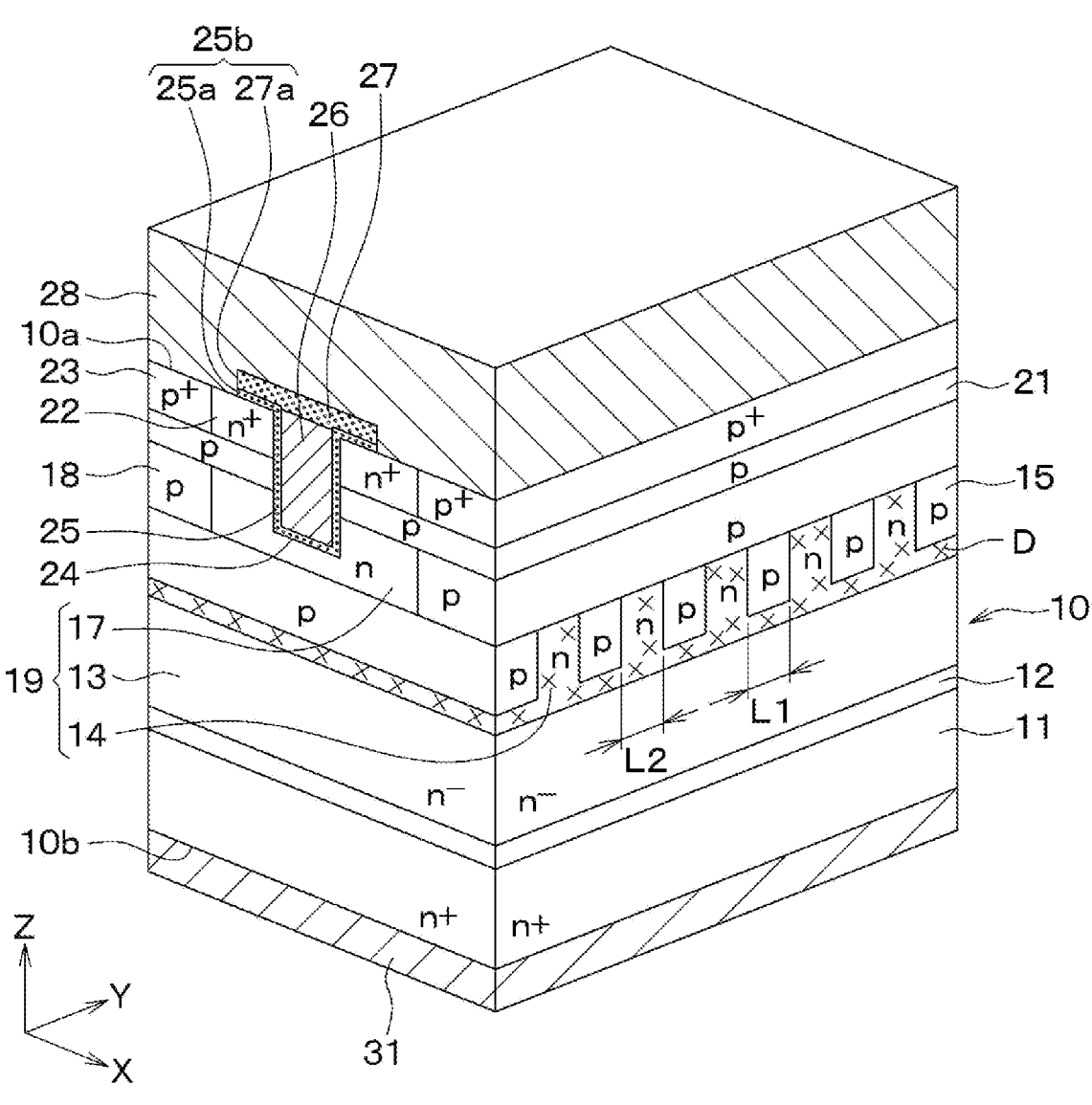
FIG. 2 is a perspective view illustrating a cell section in FIG. 1.

A first embodiment will be described with reference to FIGS. 1 and 2. In a SiC semiconductor device S1 of the present embodiment, an inverted-type MOSFET having a trench gate structure is formed as a switching element.

The SiC semiconductor device S1 is configured to have a cell section 1 in which the MOSFET having a trench gate structure is formed, and an outer peripheral section 2 surrounding the cell section 1. The outer peripheral section 2 is configured to have a guard ring section 2a and a connecting section 2b disposed inside the guard ring section 2a. In other words, the outer peripheral section 2 is configured to have the guard ring section 2a and the connecting section 2b disposed between the cell section 1 and the guard ring section 2a. The following description will be made assuming that one direction in the planar direction of a substrate 11 to be described later is an X-axis direction, a direction intersecting with the one direction in the planar direction of the substrate is a Y-axis direction, and a direction orthogonal to the X-axis direction and the Y-axis direction is a Z-axis direction. In the present embodiment, the X-axis direction is orthogonal to the Y-axis direction. In FIG. 1, the horizontal direction of the paper corresponds to the X-axis direction, the depth direction of the paper corresponds to the Y-axis direction, and the vertical direction of the paper corresponds to the Z-axis direction.

The SiC semiconductor device S1 is formed by using a semiconductor substrate 10. Specifically, the SiC semiconductor device S1 includes the n+-type substrate 11 made of SiC. In the present embodiment, for example, a substrate, having an off angle of 0 to 8° with respect to a (0001) Si surface, an n-type impurity concentration of nitrogen, phosphorus, or the like of $1.0 \times 10^{19}/cm^3$, and a thickness of about 300 μm, is used as the substrate 11. Note that the substrate 11 forms a drain region in the present embodiment.

An n-type buffer layer 12 made of SiC is formed on the surface of the substrate 11. The buffer layer 12 is formed by performing epitaxial growth on the surface of the substrate 11. The buffer layer 12 is designed to have an n-type impurity concentration between the substrate 11 and a low-concentration layer 13 to be described later, and a thickness of about 1 μm.

On the surface of the buffer layer 12, the n⁻-type low-concentration layer 13 made of SiC, designed to have, for example, an n-type impurity concentration of 5.0 to 10.0× $10^{15}$/cm³ and a thickness of about 10 to 15 μm, is formed. In the low-concentration layer 13, the impurity concentration may be constant in the Z-axis direction, but it is preferable that the concentration distribution is inclined and the concentration in a portion, on the substrate 11 side, of the low-concentration layer 13 is higher than the concentration in a portion on the side away from the substrate 11. It is preferable that a portion of the low-concentration layer 13, away from the surface of the substrate 11 by up to about 3 to 5 μm, has an impurity concentration higher than the other portions by about 2.0×$10^{15}$/cm³. With such a configuration, the internal resistance of the low-concentration layer 13 can be reduced, and the on-resistance can be reduced. The low-concentration layer 13 is formed as an epitaxial layer by epitaxial growth.

In a surface layer portion of the low-concentration layer 13, JFET portions 14 and first deep layers 15 are formed in the cell section 1 and the connecting section 2*b* of the outer peripheral section 2. In the present embodiment, the JFET portions 14 and the first deep layers 15 are each extended along the X-axis direction and have linear portions that are alternately and repeatedly aligned and disposed in the Y-axis direction. That is, the JFET portion 14 and the first deep layer 15 are designed to have stripe shapes each extended along the X-axis direction in a normal direction with respect to the surface of the substrate 11 (hereinafter, also simply referred to as a normal direction) and are configured to have a layout in which the stripe shapes are alternately aligned along the Y-axis direction. In other words, the phrase: in the normal direction with respect to the surface of the substrate 11 can also be referred to as when viewed from the normal direction with respect to the surface of the substrate 11.

The JFET portion 14 is designed to be an n-type having an impurity concentration higher than the low-concentration layer 13 and have a depth of 0.3 to 1.5 μm. In the present embodiment, the JFET portion 14 is designed to have an n-type impurity concentration of 7.0×$10^{16}$ to 5.0×$10^{17}$/cm³. The JFET portion 14 of the present embodiment is designed to be an ion-implanted layer formed by ion-implanting n-type impurities into the low-concentration layer 13, and defect portions D formed by the ion implantation are formed.

The first deep layer 15 is designed to have a p-type impurity concentration of, for example, boron of 2.0×$10^{17}$ to 2.0×$10^{18}$/cm³. The first deep layer 15 of the present embodiment is extended to the guard ring section 2*a* side more than the JFET portion 14.

The first deep layer 15 of the present embodiment is formed shallower than the JFET portion 14. That is, the first deep layer 15 is formed such that the bottom portion is located in the JFET portion 14. In other words, the first deep layer is formed such that the JFET portion 14 is located with the low-concentration layer 13.

The first deep layer 15 of the present embodiment is designed to have a width L1 of 0.9 μm or less. Note that the width L1 of the first deep layer 15 means a length in a direction orthogonal to the longitudinal direction of the first deep layer 15, and means a length in a direction along the planar direction of the semiconductor substrate 10. That is, the width L1 of the first deep layer 15 means the length, along the Y-axis direction, of the first deep layer 15.

Furthermore, the first deep layer 15 is designed to have an interval L2 between the adjacent first deep layers 15 of 0.75 to 1.1 μm. The interval L2 between the adjacent first deep layers 15 means a length, along the Y-axis direction, of a portion of the JFET portion 14 sandwiched between the first deep layers 15.

In the surface layer portion of the low-concentration layer 13, a plurality of p-type guard rings 16 are provided in the guard ring section 2*a* of the outer peripheral section 2 so as to surround the cell section 1. In the present embodiment, the layout of the upper surface of the guard ring 16 is designed to have a rectangular shape, a circular shape, or the like in which four corners are rounded in the normal direction.

A current diffusion layer 17 and a second deep layer 18 are formed on the JFET portions 14 and the first deep layers 15 in the cell section 1.

The current diffusion layer 17 is formed by an n-type impurity layer and is designed to have a thickness of 0.5 to 2 μm. The n-type impurity concentration in the current diffusion layer 17 is designed to be, for example, 1.0×$10^{16}$ to 5.0×$10^{17}$/cm³. The current diffusion layer 17 is joined with the JFET portion 14. Therefore, in the present embodiment, the low-concentration layer 13, the JFET portion 14, and the current diffusion layer 17 are joined to form a drift layer 19.

The second deep layer 18 is formed in the cell section 1, and is designed to have, for example, a p-type impurity concentration of 2.0×$10^{17}$ to 2.0×$10^{18}$/cm³ and a thickness equal to the current diffusion layer 17. The second deep layer 18 is formed to be connected to the first deep layer 15.

The current diffusion layer 17 and the second deep layer 18 are extended in a direction intersecting with the stripe-shaped portion of the JFET portion 14 and the longitudinal direction of the first deep layer 15. In the present embodiment, a layout is formed in which the current diffusion layer 17 and the second deep layer 18 are extended in the Y-axis direction as the longitudinal direction and a plurality of layers are alternately aligned in the X-axis direction. A formation pitch between the current diffusion layer 17 and the second deep layer 18 is matched to a formation pitch between trench gate structures to be described later, and the second deep layers 18 are formed to sandwich a trench 24 to be described later.

In addition, the current diffusion layer 17 and a resurf layer 20 are formed on the low-concentration layer 13, the JFET portion 14, the first deep layer 15, and the guard ring 16 in the outer peripheral section 2. The resurf layer 20 is formed in the connecting section 2*b* of the outer peripheral section and is formed to be connected to the first deep layer 15.

A p-type base layer 21 is formed on the current diffusion layer 17, the second deep layer 18, and the resurf layer 20. An n⁺-type source region 22 and a p⁺-type contact region 23 are formed in a surface layer portion of the base layer 21 in the cell section 1. The source region 22 is formed to be in contact with a side surface of a trench 24 to be described later, and the contact region 23 is formed on a side opposite to the trench 24 with the source region 22 interposed therebetween. In the present embodiment, the source region 22 corresponds to an impurity region.

The base layer 21 is designed to have, for example, a p-type impurity concentration of $3.0 \times 10^{17}/\text{cm}^3$ or less. In addition, the base layer 21 of the present embodiment is formed by, for example, ion implantation, and the impurity concentration in the cell section 1 is higher than the outer peripheral section 2. The source region 22 is designed to have an n-type impurity concentration in the surface layer portion, that is, a surface concentration of, for example, $1.0 \times 10^{21}/\text{cm}^3$. The contact region 23 is designed to have a p-type impurity concentration in the surface layer portion, that is, a surface concentration of, for example, $1.0 \times 10^{21}/\text{cm}^3$.

The thicknesses of the base layer 21 and the source region 22 are adjusted such that a channel length is 0.4 μm or less. Note that the channel length here means, in the Z-axis direction (i.e., the stacking direction of the substrate 11 and the buffer layer 12), a length of a portion, along the side surface of the trench 24, of the base layer 21. In other words, the channel length means the length, between the source region 22 and the current diffusion layer 17, of the base layer 21.

In the present embodiment, the substrate 11, the buffer layer 12, the low-concentration layer 13, the JFET portion 14, the first deep layer 15, the current diffusion layer 17, the second deep layer 18, the base layer 21, the source region 22, the contact region 23, and the like are stacked to form the semiconductor substrate 10, as described above. Hereinafter, the surface, on the substrate 11 side, of the semiconductor substrate 10 is referred to as the other surface 10*b* of the semiconductor substrate 10, and the surface on the side of the source region 22 and the contact region 23 is referred to as one surface 10*a* of the semiconductor substrate 10. The source region 22 and the contact region 23 are in states of being exposed from the one surface 10*a* of the semiconductor substrate 10.

In the semiconductor substrate 10, the trench 24, designed to have a width of, for example, 1.4 to 2.0 μm, is formed in the cell section 1 so as to penetrate the base layer 21 and the like to reach the current diffusion layer 17 and have a bottom surface located in the current diffusion layer 17. The trench 24 is formed so as not to reach the JFET portion 14 and the first deep layer 15. That is, the trench 24 is formed such that the JFET portion 14 and the first deep layer 15 are located below the bottom surface.

In addition, a plurality of the trenches 24 are extended so as to extend along the Y-axis direction, are aligned at equal intervals in the X-axis direction, and are formed in stripe shapes. That is, in the present embodiment, the trench 24 is formed such that the longitudinal direction is orthogonal to the longitudinal direction of the first deep layer 15. The trench 24 is formed to be sandwiched between the second deep layers 18 in the normal direction. The trench 24 of the present embodiment is formed such that the distance between the centers of the adjacent trenches 24 (i.e., a trench pitch) is 3.0 μm or less.

The trench 24 is filled with a gate insulating film 25 formed on the inner wall surface and a gate electrode 26 formed by doped Poly-Si formed on the surface of the gate insulating film 25. As a result, the trench gate structure is formed. Although not particularly limited, the gate insulating film 25 is formed by performing thermal oxidation or CVD (abbreviation of chemical vapor deposition) on the inner wall surface of the trench 24. The gate insulating film 25 is designed to have a thickness of about 100 nm on both the side surface side and bottom surface side of the trench 24.

The gate insulating film 25 is also formed on surfaces other than the inner wall surface of the trench 24. Specifically, the gate insulating film 25 is also formed to cover a part of the one surface 10*a* of the semiconductor substrate 10. More specifically, the gate insulating film 25 is also formed to cover a part of the surface of the source region 22. In other words, in the gate insulating film 25, a contact hole 25*a* that exposes the rest of the contact region 23 and the source region 22 is formed in a portion different from the portion where the gate electrode 26 is disposed.

The gate insulating film 25 is also formed on the surface of the base layer 21 in the connecting section 2*b*. Similarly to the gate insulating film 25, the gate electrode 26 is also extended onto the surface of the gate insulating film 25 in the connecting section 2*b*. The trench gate structure of the present embodiment is formed as described above.

In the semiconductor substrate 10, a recessed portion 10*c* is formed in the guard ring section 2*a* of the outer peripheral section 2 so as to penetrate the base layer 21 and reach the resurf layer 20 and the current diffusion layer 17. In the SiC semiconductor device S1 of the present embodiment, a mesa structure having such a structure is formed. In the connecting section 2*b*, the contact region 23 is formed in the surface layer portion of the base layer 21, similarly to the cell section 1.

On the one surface 10*a* of the semiconductor substrate 10, an interlayer insulating film 27 is formed to cover the gate electrode 26, the gate insulating film 25, and the like. The interlayer insulating film 27 is formed by BPSG (abbreviation of Borophosphosilicate Glass) or the like.

A contact hole 27*a* that communicates with the contact hole 25*a* and exposes the source region 22 and the contact region 23 is formed in the interlayer insulating film 27. A contact hole 27*b* that exposes a portion, extended to the connecting section 2*b*, of the gate electrode 26 is also formed in the interlayer insulating film 27. That is, in the interlayer insulating film 27, the contact hole 27*a* is formed in the cell section 1, and the contact hole 27*b* is formed in the outer peripheral section 2.

The contact hole 27*a* formed in the interlayer insulating film 27 is formed to communicate with the contact hole 25*a* formed in the gate insulating film 25, and functions as one contact hole together with the contact hole 25*a*. Therefore, hereinafter, the contact hole 25*a* and the contact hole 27*a* are also collectively referred to as a contact hole 25*b*. The pattern of the contact holes 25*b* is arbitrary, and examples thereof include a pattern in which a plurality of square-shaped holes are arranged, a pattern in which rectangular-linear-shaped holes are arranged, and a pattern in which linear-shaped holes are aligned. In the present embodiment, the contact hole 25*b* is designed to have a linear shape along the longitudinal direction of the trench 24.

A source electrode 28 to be electrically connected to the source region 22 and the contact region 23 through the contact hole 25*b* is formed on the interlayer insulating film 27. The source electrode 28 of the present embodiment is also connected to the contact region 23 formed in the base layer 21 of the outer peripheral section 2. A gate wiring 29 to be electrically connected to the gate electrode 26 through the contact hole 27*b* is formed on the interlayer insulating film 27. In the present embodiment, the source electrode 28 corresponds to a first electrode.

The source electrode 28 of the present embodiment is e made of, for example, a plurality of metals such as Ni/Al. A portion to be in contact with a portion forming, of the plurality of metals, n-type SiC (i.e., the source region 22) is made of a metal capable of being in ohmic contact with the n-type SiC. At least a portion to be in contact with, of the plurality of metals, p-type SiC (i.e., the contact region 23) is made of a metal capable of being in ohmic contact with the p-type SiC. The gate wiring 29 may have the same configuration as the source electrode, or may be made of Al—Si or the like.

Furthermore, a protective film 30 made of polyimide or the like is formed to cover the connecting section 2b and the guard ring section 2a. In the present embodiment, the protective film 30 is formed from the outer peripheral section 2 to the upper of the outer edge of the cell section 1 in order to suppress occurrence of creeping discharge between the source electrode 28 and a drain electrode 31 to be described later. Specifically, the protective film 30 is formed, in the cell section 1, so as to cover a portion, on the outer peripheral section 2 side, of the source electrode 28 and to expose a portion, on the inner edge side, of the source electrode 28.

On the other surface 10b side of the semiconductor substrate 10, the drain electrode 31 to be electrically connected to the substrate 11 is formed. In the present embodiment, the drain electrode 31 corresponds to a second electrode. In the SiC semiconductor device S1 of the present embodiment, a MOSFET having a trench gate structure, an inverted type of an n-channel type, is formed by such a structure. With such a structure of the SiC semiconductor device S1 of the present embodiment, a parasitic diode is formed by a p-n junction between the drift layer 19 and the base layer 21 and the like.

The configuration of the SiC semiconductor device S1 of the present embodiment has been described above. In the present embodiment, the $n^+$-type, the n-type, and the $n^-$-type correspond to a first conductivity type, and the $p^-$-type, the p-type, and the $p^+$-type correspond to a second conductivity type. Next, operations and effects of the SiC semiconductor device S1 will be described.

Figure 3:
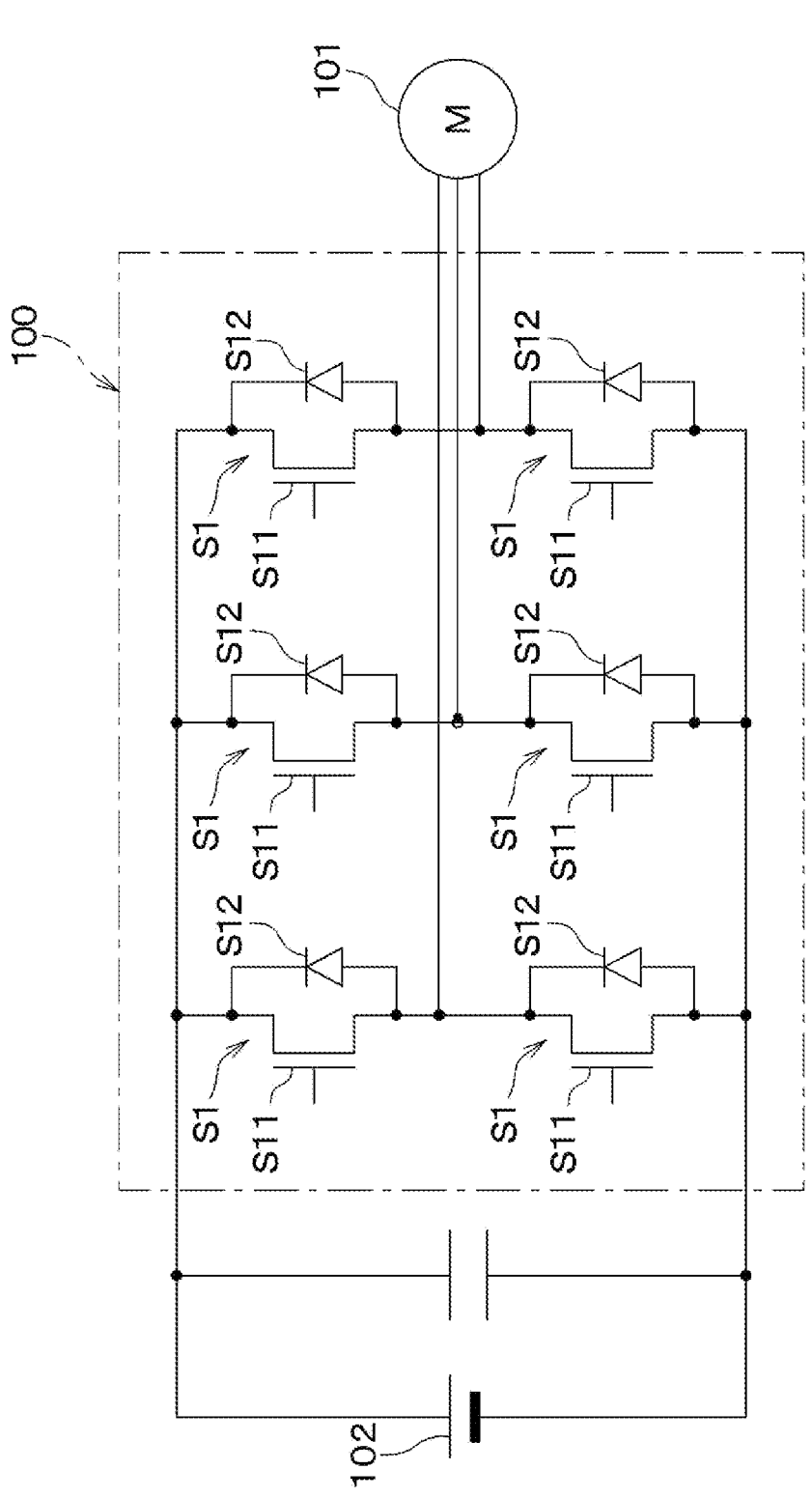
FIG. 3 is a view illustrating an inverter circuit formed using the SiC semiconductor device illustrated in FIG. 1.

The SiC semiconductor device S1 is used to form, for example, an inverter circuit 100 as illustrated in FIG. 3. The inverter circuit 100 is used, for example, for driving a tree-phase motor 101, and is used when an AC current is supplied to the three-phase motor 101 using a DC power supply 102.

Specifically, the inverter circuit 100 connects in parallel a plurality of bridge circuits in which an upper arm and a lower arm are connected in series for the DC power supply 102, and alternately and repeatedly turns on and off the upper arm and the lower arm of each bridge circuit to supply an AC current to a load. The inverter circuit 100 is formed with a freewheeling diode S12 connected in parallel to a MOSFET S11. Then, in a case where the inverter circuit 100 is formed using the SiC semiconductor device S1 of the present embodiment, each of the upper arm and the lower arm of each phase is formed by the SiC semiconductor device S1. More specifically, the MOSFET of the SiC semiconductor device S1 forms the MOSFET 11 of each arm, and the parasitic diode of the SiC semiconductor device S1 forms the freewheeling diode S2 of each arm.

In each bridge circuit of such an inverter circuit 100, a current is supplied to a load by turning on the MOSFET S11 of the upper arm and turning off the MOSFET S11 of the lower arm. Thereafter, the current supply is stopped by turning off the MOSFET S11 of the upper arm and turning on the MOSFET S11 of the lower arm.

At this time, the operation of the SiC semiconductor device S1 of the upper arm, for example, is as follows. That is, in this SiC semiconductor device S1, an inversion layer is not formed in the base layer 21 in an off-state before a gate voltage is applied to the gate electrode 26. Therefore, even if a positive voltage, for example, 1600 V, is applied to the drain electrode 31, electrons do not flow from the source region 22 into the base layer 21, and the SiC semiconductor device S1 enters an off-state in which no current flows between the source electrode 28 and the drain electrode 31.

When the SiC semiconductor device S1 is in the off-state, an electric field is applied between the drain and the gate, and electric field concentration can occur at the bottom portion of the gate insulating film 25. In the SiC semiconductor device S1, however, the first deep layer 15 and the JFET portion 14 are provided at positions deeper than the trench 24. Therefore, a depletion layer formed between the first deep layer 15 and the JFET portion 14 suppresses equipotential lines from rising due to an influence of a drain voltage, and a high electric field is less likely to enter the gate insulating film 25. Therefore, it is possible in the present embodiment to suppress the gate insulating film 25 from being destroyed.

Then, when a predetermined gate voltage, for example, 20 V, is applied to the gate electrode 26, a channel is formed on the surface, in contact with the trench 24, of the base layer 21. As a result, a current flows between the source electrode 28 and the drain electrode 31, and the SiC semiconductor device S1 enters an on-state. In the present embodiment, the electrons having passed through the channel pass through the current diffusion layer 17, the JFET portion 14, and the low-concentration layer 13 and flow to the substrate 11, and thus it can be said that the drift layer 19, including the current diffusion layer 17, the JFET portion 14, and the low-concentration layer 13, is formed.

Thereafter, when the SiC semiconductor device S1 enters the off-state from the on-state, a reverse bias is applied to bring the SiC semiconductor device S1 into a reverse conduction state, and thus the parasitic diode functions as the freewheeling diode S12, and a freewheeling current flows through the parasitic diode. Then, holes diffused from the p-type layer side to the n-type layer side of the p-n junction forming the parasitic diode are recombined with electrons in the n-type layer. At this time, the recombination energy is large, and thus basal plane dislocation (hereinafter, referred to as BPD) in the substrate 11 or the buffer layer 12 can expand to create the SF.

Figure 4:
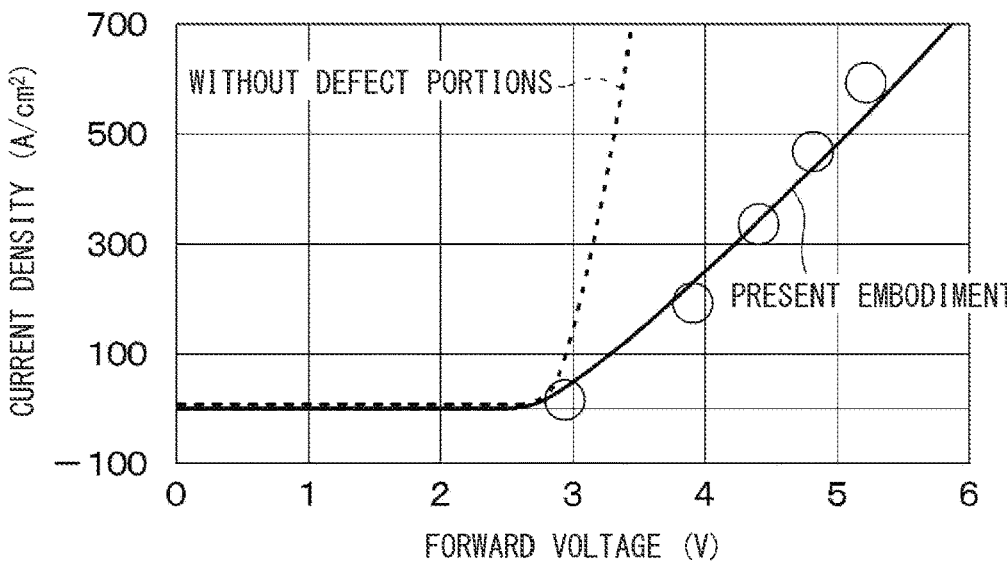
FIG. 4 is a graph showing a relationship between a forward voltage and a current density when the SiC semiconductor device is in reverse conduction.

Therefore, in the present embodiment, the defect portions D are formed in the JFET portion 14. As a result, when the SiC semiconductor device S1 is in reverse conduction, the defect portions D function as hole traps. Therefore, the current density at the time of reverse conduction can be reduced as compared with the SiC semiconductor device S1 in which the defect portions D are not formed, as shown in FIG. 4, and it is possible to suppress holes from reaching the low-concentration layer 13. As a result, it is possible to suppress the BPD from expanding to the SF, and it is possible to suppress an increase in an on-voltage.

In the present embodiment, the base layer 21 is designed to have an impurity concentration higher in the cell section 1 than in the outer peripheral section 2. Therefore, when the SiC semiconductor device S1 is in the reverse conduction state, the forward voltage in the cell section 1 tends to be lower than the forward voltage in the outer peripheral section 2. Therefore, the forward current is likely to flow to the cell section 1 in which the defect portions D are formed, and it is possible in the outer peripheral section 2 to suppress the BPD from expanding to the SF.

Hereinafter, further detailed conditions and effects in the SiC semiconductor device S1 of the present embodiment will be described.

First, in the SiC semiconductor device S1, the first deep layer 15 is formed shallower than the JFET portion 14. The JFET portion 14 is also disposed between the first deep layer 15 and the low-concentration layer 13. Therefore, holes can also be trapped by the JFET portion 14 between the first deep layer 15 and the low-concentration layer 13. Therefore, an SF area occupancy rate can be reduced as shown in FIG. 5.

Figure 5:
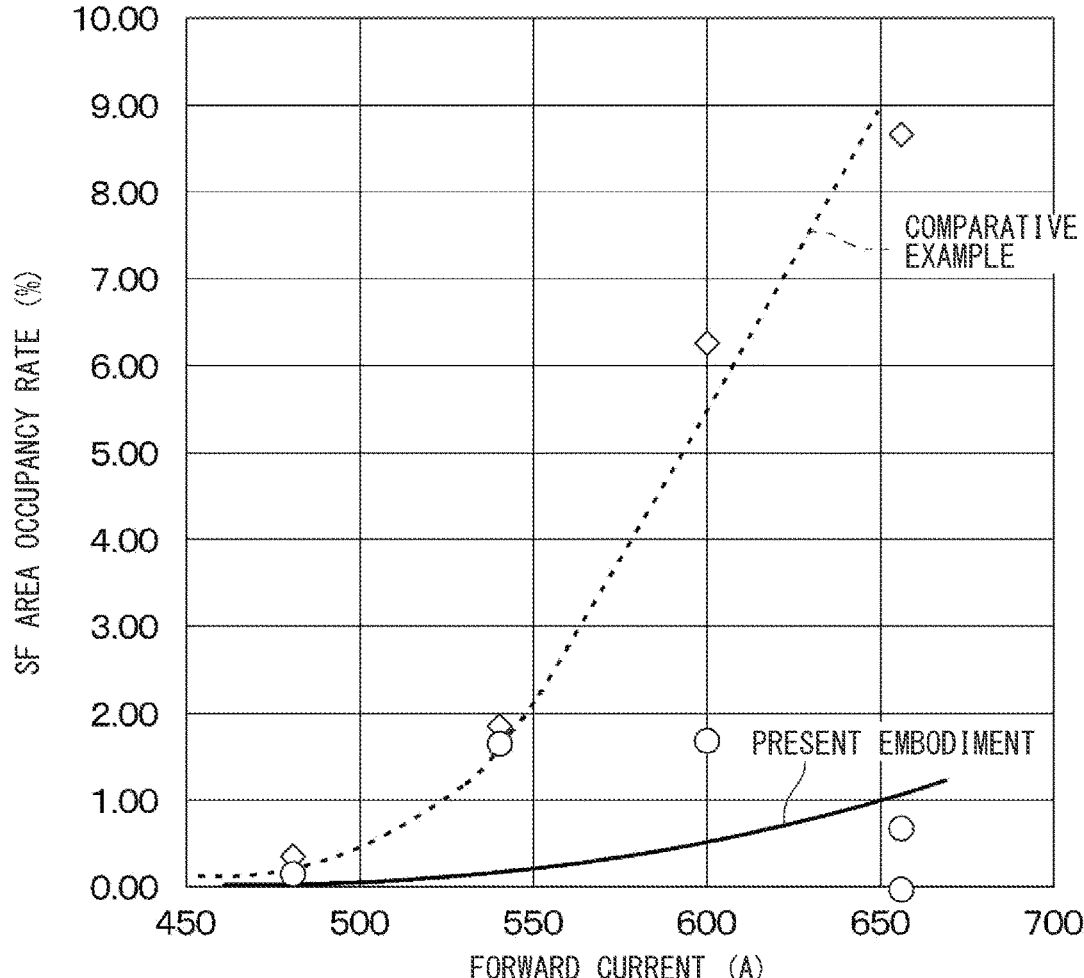
FIG. 5 is a graph showing a relationship between a forward current and an SF area occupancy rate.

In FIG. 5, the SiC semiconductor device S1, in which the JFET portion 14 and the first deep layer 15 are formed at the same depth and the JFET portion 14 is not disposed between the first deep layer 15 and the low-concentration layer 13, is shown as a comparative example. The SF area occupancy rate indicates the proportion of the stacking fault in the SiC semiconductor device S1. The fact that the SF area occupancy rate is small indicates that the BPD is less likely to expand to the SF.

It has also been reported about the SiC semiconductor device S1 that, when the hole density of the holes flowing to the buffer layer 12 at the time of reverse conduction becomes $4.5 \times 10^{16}/cm^3$ or more, the BPD is likely to expand to the SF. The present inventors have also confirmed that, when the hole density of the holes flowing to the buffer layer 12 is $4.5 \times 10^{16}/cm^3$ or more, the BPD is likely to expand to the SF. Therefore, the SiC semiconductor device S1 of the present embodiment is configured to satisfy the following conditions.

Figure 6:
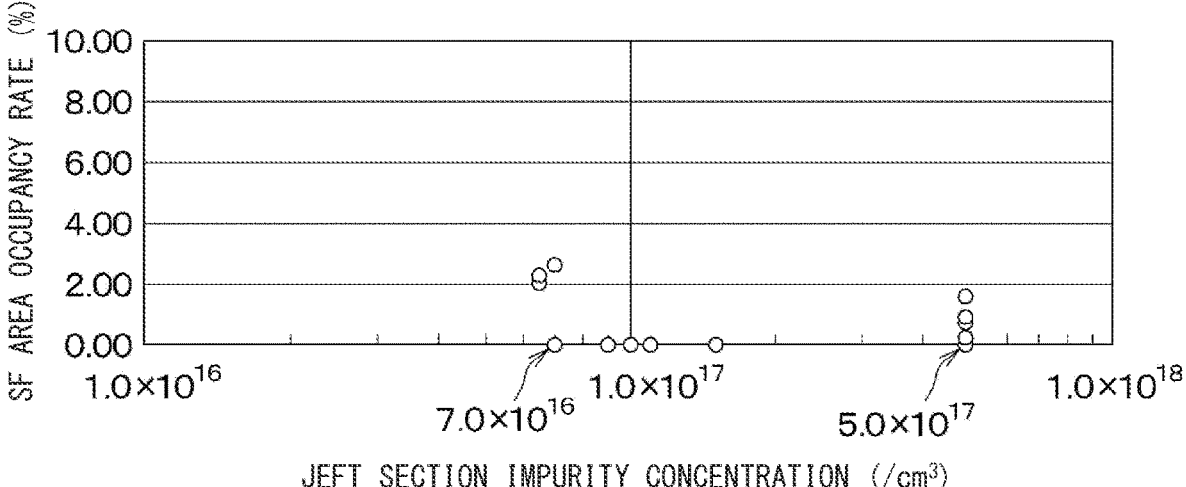
FIG. 6 is a graph showing a relationship between an impurity concentration in a JFET portion and an SF area occupancy rate.

First, the JFET portion 14 of the present embodiment is formed by an ion-implanted layer in which n-type impurities are ion-implanted into the low-concentration layer 13. Therefore, in the JFET portion 14, as the impurity concentration increases (i.e., the dose amount increases), the number of the defect portions D increases and the function as a hole trap layer increases. Specifically, it is confirmed as shown in FIG. 6 that, when the impurity concentration in the JFET portion 14 is $7.0 \times 10^{16}/cm^3$ or more, the SF area occupancy rate becomes small. However, it is confirmed that, when the impurity concentration in the JFET portion 14 is $5.0 \times 10^{17}/cm^3$ or more, the SF area occupancy rate increases. This is presumed to be because the number of the defect portions D formed in the JFET portion 14 is too large, SFs are formed due to the defect portions D, not the BPD expanding to the SF. Therefore, in the present embodiment, the JFET portion 14 is formed by an ion-implanted layer and is designed to have an impurity concentration of $7.0 \times 10^{16}$ to $5.0 \times 10^{17}/cm^3$.

Figure 7:
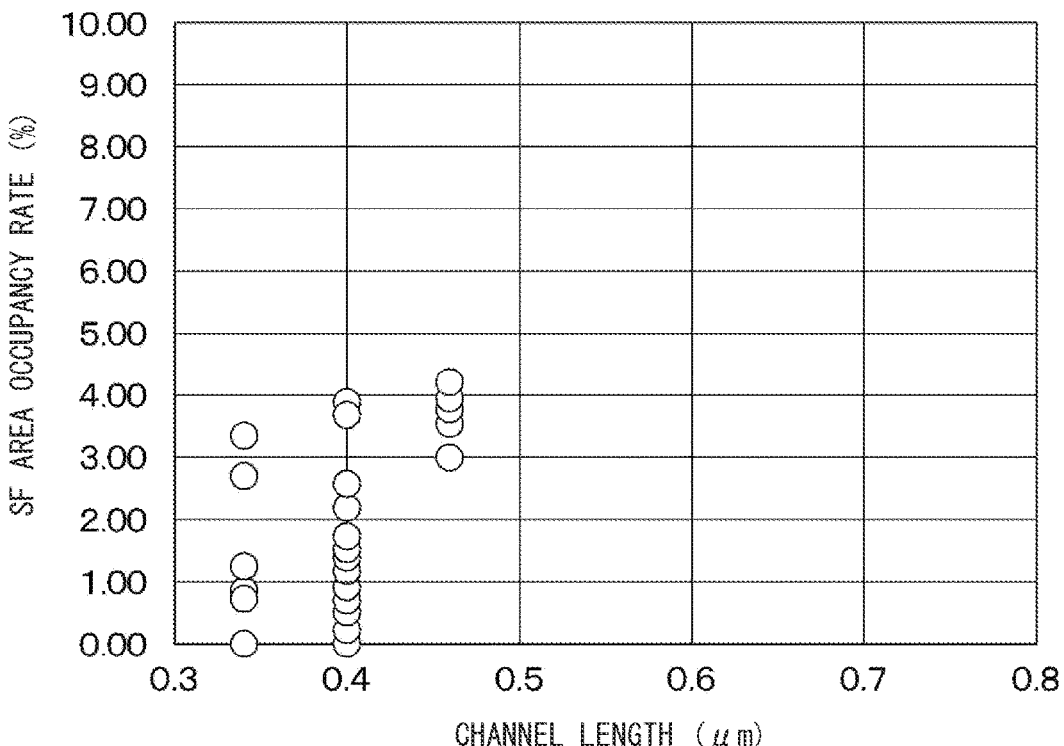
FIG. 7 is a graph showing a relationship between a channel length and an SF area occupancy rate.

At the time of reverse conduction in the SiC semiconductor device S1, the proportion of an electron current to flow in the base layer 21 by a punch-through mode can be increased by shortening the channel length, so that the proportion of a hole current can be reduced. By reducing the proportion of a hole current, the holes to reach the BPD can also be reduced, so that it is possible to suppress the BPD from expanding to the SF. Specifically, it is confirmed as shown in FIG. 7 that, when the channel length is 0.4 μm or less, the SF area occupancy rate may be 0 and as the channel length becomes smaller than 0.4 μm, the SF area occupancy rate reduces. Therefore, in the present embodiment, the thickness of the base layer 21 and the depth of the source region 22 are adjusted such that the channel length becomes 0.4 μm or less.

Figure 8:
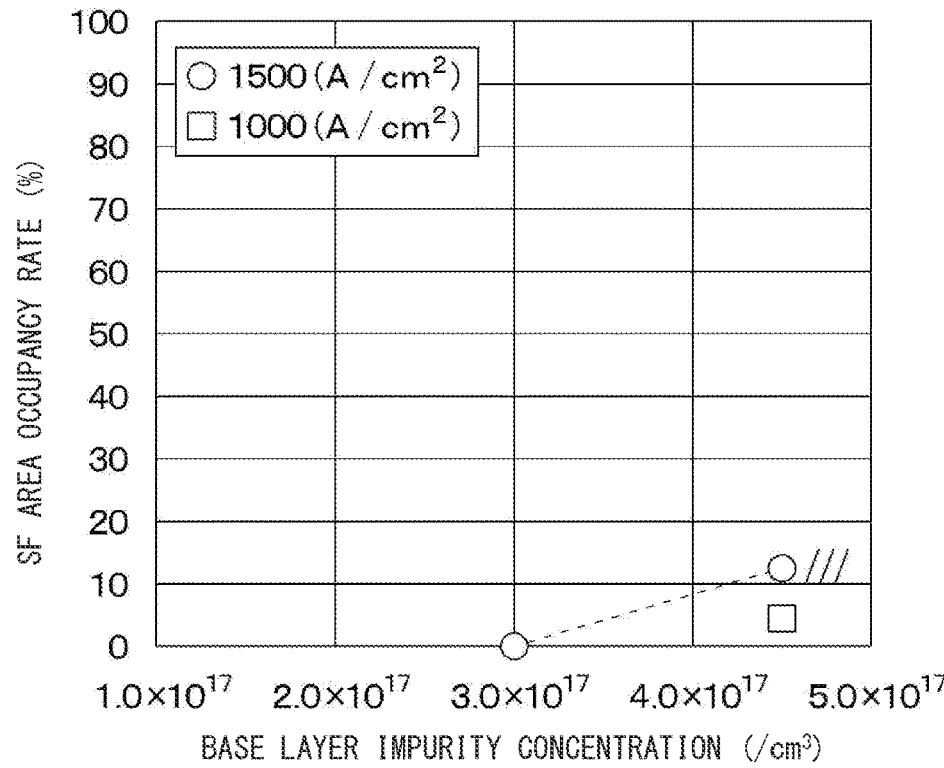
FIG. 8 is a graph showing a relationship between an impurity concentration in a base layer and an SF area occupancy rate.

Alternatively, as the structure for increasing the proportion of the electron current and reducing the proportion of a hole current, the impurity concentration in the base layer 21 may be reduced. Specifically, when the impurity concentration in the base layer 21 is made equal to or less than $3.0 \times 10^{17}/cm^3$, the SF area occupancy rate may be 0, as shown in FIG. 8. Therefore, in the present embodiment, the impurity concentration in the base layer 21 is designed to be $3.0 \times 10^{17}/cm^3$ or less.

Figure 9:
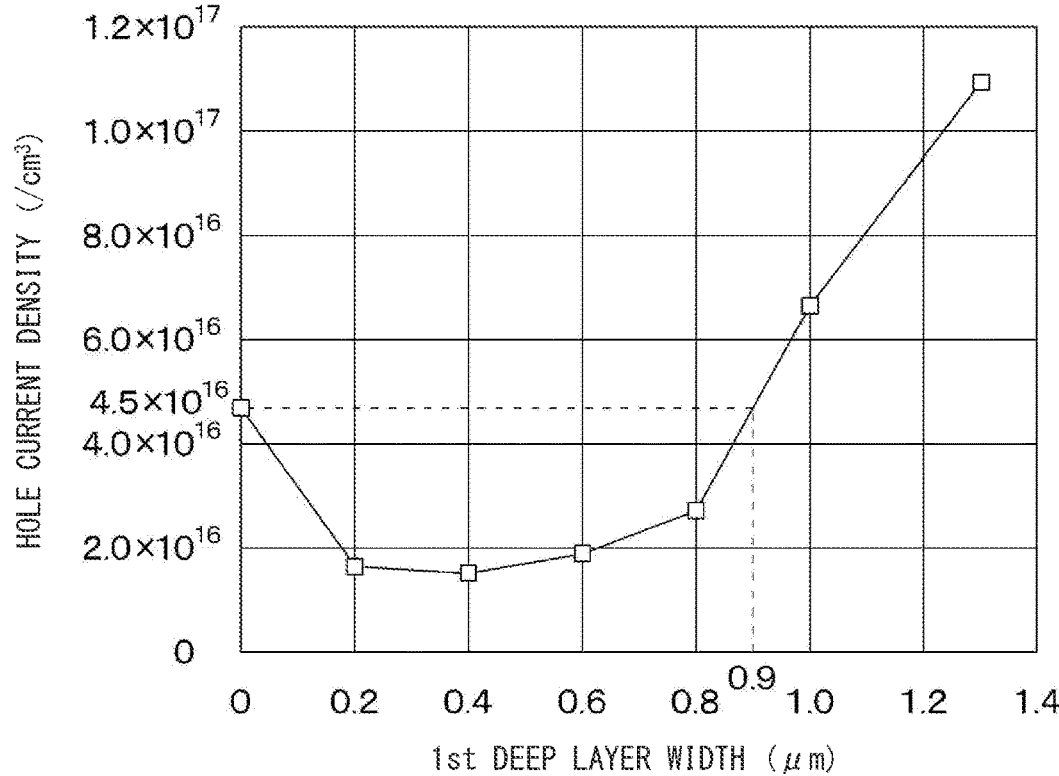
FIG. 9 is a graph showing a relationship between a width of a first deep layer and a hole current density.

Furthermore, as the structure for increasing the proportion of the electron current and reducing the proportion of a hole current, the width L1 of the first deep layer 15 may be defined. Specifically, when the width L1 of the first deep layer 15 is 0.9 μm or less, a hole current density can be made equal to or less than $4.5 \times 10^{16}/cm^3$, as shown in FIG. 9. Therefore, in the present embodiment, the width L1 of the first deep layer 15 is designed to be 0.9 μm or less. The hole current density in FIG. 9 indicates the density of the hole current flowing to the buffer layer 12.

Figure 10:
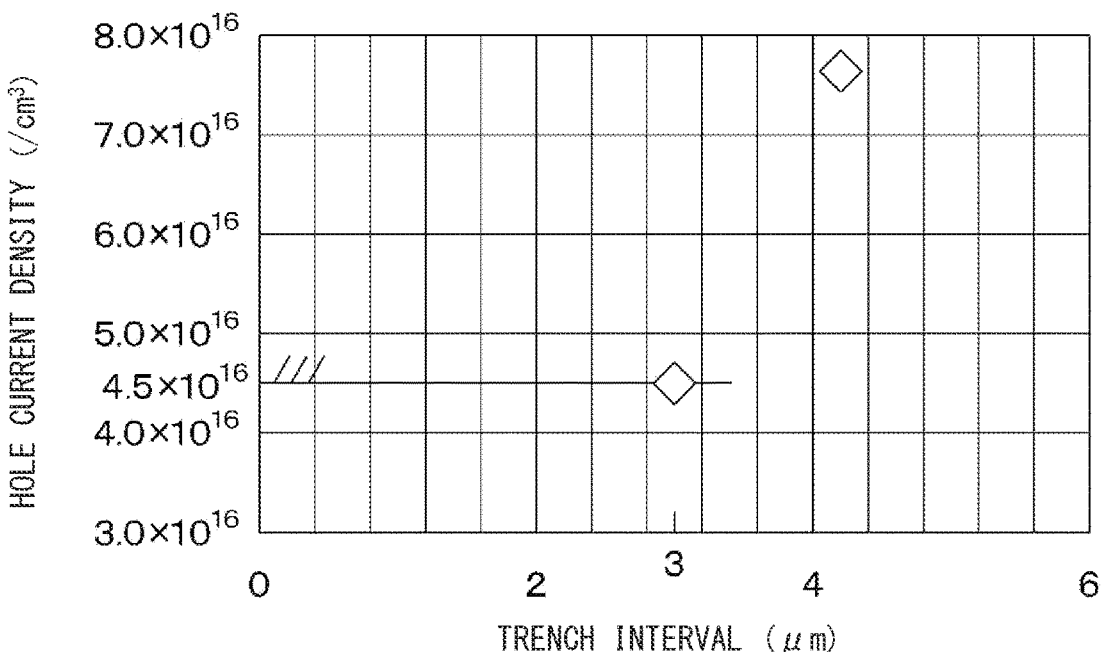
FIG. 10 is a graph showing a relationship between an interval between trenches and a hole current density.

Furthermore, as the structure for increasing the proportion of the electron current and reducing the proportion of the hole current, the distance between the centers of the adjacent trenches 24 (i.e., a trench pitch) may be defined. Specifically, by making the distance between the centers of the adjacent trenches 24 equal to or less than 3.0 μm, the hole current density can be made equal to or less than $4.5 \times 10^{16}/cm^3$, as shown in FIG. 10. The hole current density in FIG. 10 indicates the density of the hole current flowing to the buffer layer 12.

In the SiC semiconductor device S1 as described above, the following characteristics are also important characteristics.

Figure 11:
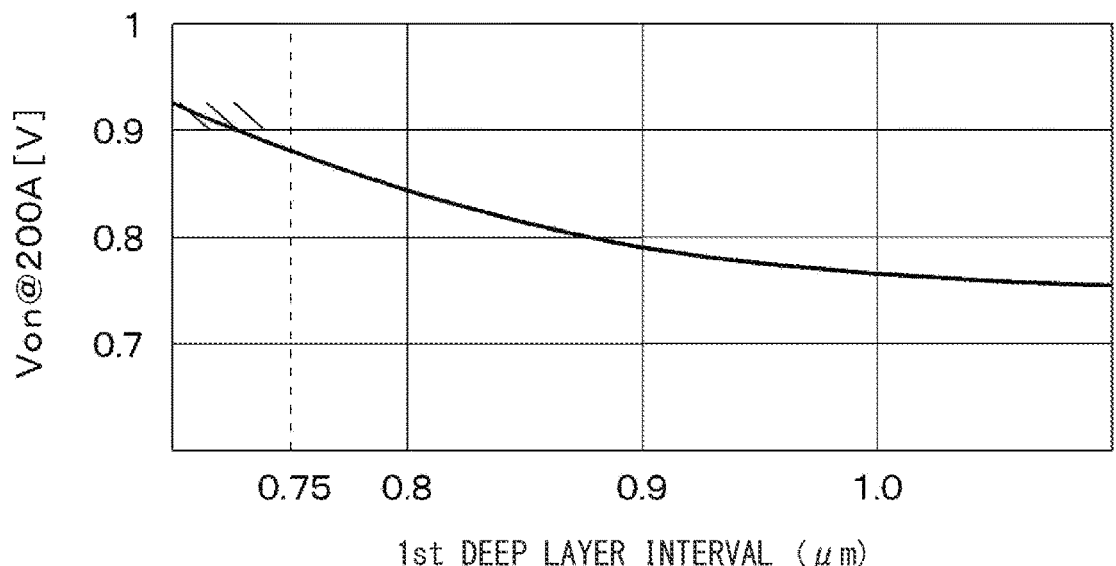
FIG. 11 is a graph showing a relationship between an interval between first deep layers and an on-voltage.

First, an on-voltage (i.e., Von), when the SiC semiconductor device S1 is in the on-state, reduces as the interval L2 between the adjacent first deep layers 15 increases, as shown in FIG. 11, since the width of the JFET portion 14 sandwiched between the first deep layers 15 increases. When 200 A is made to flow, it is desired at present to set the on-voltage to 0.9 V or less. Therefore, the interval L2 between the adjacent first deep layers 15 is designed to be 0.75 μm or more.

Figure 12:
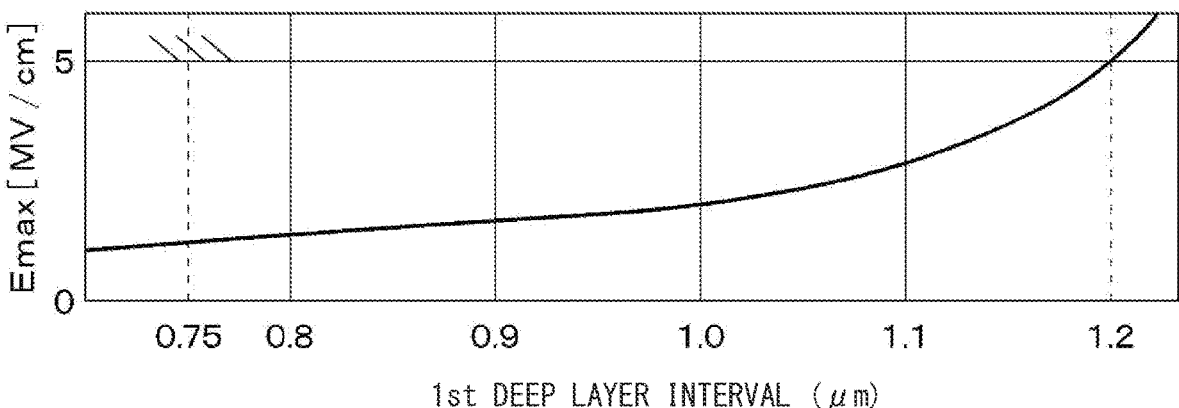
FIG. 12 is a graph showing a relationship between an interval between first deep layers and an electric field applied to a gate insulating film.

In addition, an electric field (i.e., Emax) to be applied to the gate insulating film 25 in the off-state increases as the interval L2 between the adjacent first deep layers 15 increases, as shown in FIG. 12, since the width of the JFET portion 14 sandwiched between the first deep layers 15 increases. It is desired at present to set the electric field to be applied to the gate insulating film 25 in the off-state to 5 MV/cm or less. Therefore, the interval L2 between the adjacent first deep layers 15 is designed to be 1.2 μm or less.

Figure 13:
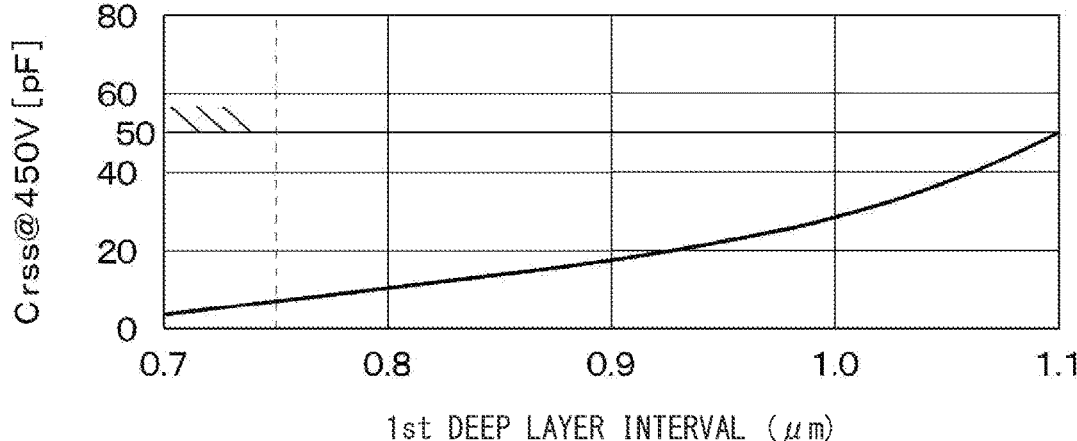
FIG. 13 is a graph showing a relationship between an interval between first deep layers and a feedback capacitance.

Furthermore, a feedback capacitance (i.e., Crss) increases as the interval L2 between the adjacent first deep layers 15 increases, as shown in FIG. 13, since the width of the JFET portion 14 sandwiched between the first deep layers 15 increases. It is desired at present to set the feedback capacitance to 50 pF or less. Therefore, the interval L2 between the adjacent first deep layers 15 is designed to be 1.1 μm or less.

That is, in the present embodiment, the interval L2 between the adjacent first deep layers 15 is designed to be 0.75 to 1.1 μm.

According to the present embodiment described above, the defect portions D are formed in the JFET portion 14. Therefore, at the time of reverse conduction in the SiC semiconductor device S1, it is possible to suppress holes from reaching the BPD by being trapped by the defect portions D. Therefore, it is possible to suppress the BPD from expanding to the SF, and it is possible to suppress an increase in the on-voltage.

(1) In the present embodiment, the impurity concentration in the base layer 21 is designed to be higher in the cell section 1 than in the outer peripheral section 2. Therefore, when the SiC semiconductor device S1 is in the reverse conduction state, the forward voltage in the cell section 1 becomes lower than the forward voltage in the outer peripheral section 2. Therefore, the forward current is likely to flow to the cell section 1 in which the defect portions D are formed, and it is possible in the outer peripheral section 2 to suppress the BPD from expanding to the SF.

(2) In the present embodiment, the first deep layer 15 is formed shallower than the JFET portion 14. The JFET unit 14 is disposed between the first deep layer 15 and the low-concentration layer 13. Therefore, holes can also be trapped by the JFET portion 14 between the first deep layer 15 and the low-concentration layer 13. Therefore, it is possible to further suppress holes from reaching the BPD, and it is possible to further suppress the BPD from expanding to the SF.

(3) In the present embodiment, the JFET portion 14 is designed to have an impurity concentration of $7.0\times10^{16}$ to $5.0\times10^{17}/cm^3$. Therefore, it is possible to make the density of the hole current flowing into the buffer layer 12 equal to or lower than $4.5\times10^{16}/cm^3$, and it is possible to suppress the BPD from expanding to the SF.

(4) In the present embodiment, the channel length is designed to be 0.4 μm. Therefore, it is possible to make the density of the hole current flowing into the buffer layer 12 equal to or lower than $4.5\times10^{16}/cm^3$, and it is possible to suppress the BPD from expanding to the SF.

(5) In the present embodiment, the impurity concentration in the base layer 21 is designed to be $3.0\times10^{17}/cm^3$. Therefore, it is possible to make the density of the hole current flowing into the buffer layer 12 equal to or lower than $4.5\times10^{16}/cm^3$, and it is possible to suppress the BPD from expanding to the SF.

(6) In the present embodiment, the first deep layer 15 is designed to have a width L1 of 0.9 μm or less. Therefore, it is possible to make the density of the hole current flowing into the buffer layer 12 equal to or lower than $4.5\times10^{16}/cm^3$, and it is possible to suppress the BPD from expanding to the SF.

(7) In the present embodiment, the first deep layer 15 is extended to the outer peripheral section 2. Therefore, diode characteristics in the outer peripheral section 2 can be improved.

(8) In the present embodiment, the distance between the centers of the adjacent trenches 24 is designed to be 3.0 μm or less. Therefore, it is possible to make the density of the hole current flowing into the buffer layer 12 equal to or lower than $4.5\times10^{16}/cm^3$, and it is possible to suppress the BPD from expanding to the SF.

(9) In the present embodiment, the interval L2 between the adjacent first deep layers 15 is designed to be 0.75 μm or more. Therefore, it is possible to suppress an increase in the on-voltage.

(10) In the present embodiment, the interval L2 between the adjacent first deep layers 15 is designed to be 1.1 μm or less. Therefore, it is possible to suppress an increase in the electric field to be applied to the gate insulating film 25 in the off-state, and it is possible to suppress an increase in the feedback capacitance.

(11) In the present embodiment, a parasitic diode formed in the SiC semiconductor device S1 is used as the free-wheeling diode S12 included in the inverter circuit 100. Therefore, it is not necessary to prepare a separate member that forms the freewheeling diode S12 separately from the MOSFET 11, so that the configuration can be simplified.

Second Embodiment

A second embodiment will be described. The present embodiment is different from the first embodiment in the longitudinal direction of the first deep layer 15. The other configurations are the same as those of the first embodiment, and thus the description thereof will be omitted here.

Figure 14:
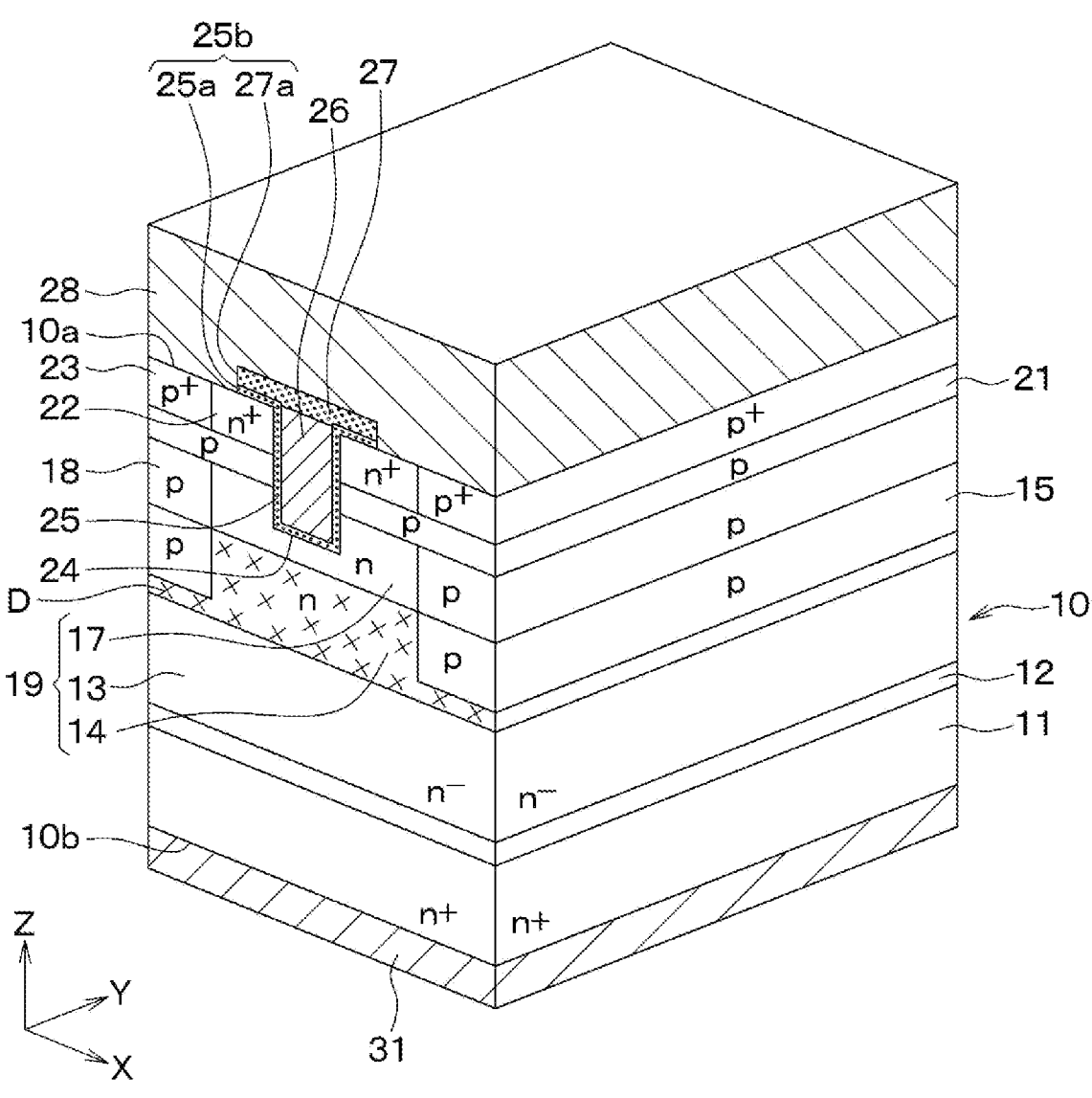
FIG. 14 is a perspective view illustrating a cell section of a SiC semiconductor device according to a second embodiment.

In the present embodiment, the first deep layer 15 and the current diffusion layer 17, in the cell section 1, have linear portions extended in the Y-axis direction as the longitudinal directions, as illustrated in FIG. 14. In addition, the first deep layers 15 are formed to sandwich the trench 24 in the normal direction.

Even when the first deep layer 15 and the current diffusion layer 17 are extended along the Y-axis direction as in the present embodiment described above, the defect portions D are formed in the JFET portion 14, so that it is possible as in the first embodiment to suppress an increase in the on-voltage.

Third Embodiment

A third embodiment will be described. The present embodiment is different from the first embodiment in that defect portions are formed in the base layer 21 and the current diffusion layer 17. The other configurations are the same as those of the first embodiment, and thus the description thereof will be omitted here.

Figure 15:
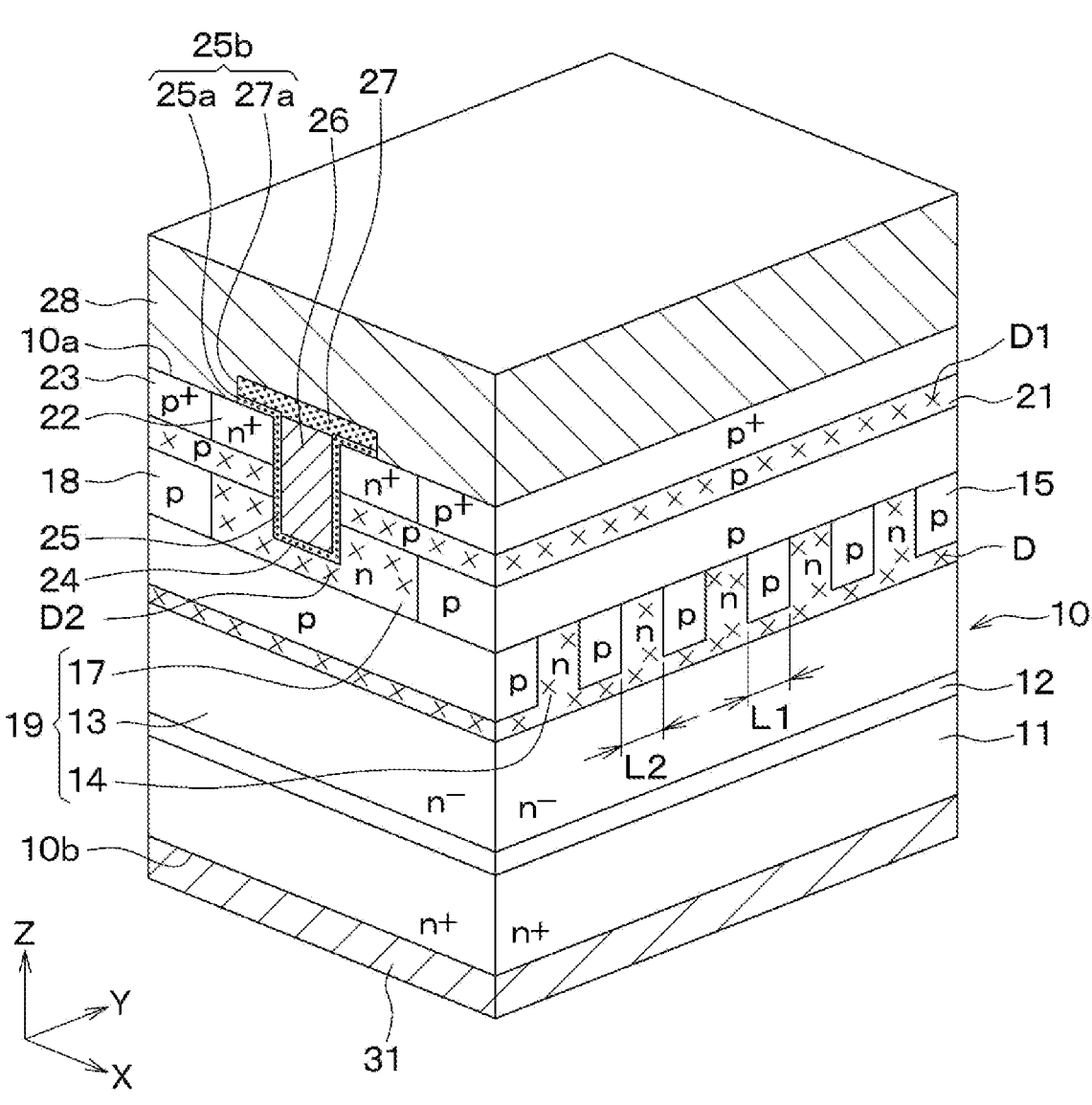
FIG. 15 is a perspective view illustrating a cell section of a SiC semiconductor device according to a third embodiment.

In the present embodiment, defect portions D1 are formed in the base layer 21, and defect portions D2 are formed in the current diffusion layer 17, as illustrated in FIG. 15. The defect portions D1 in the base layer 21 are formed by forming the base layer 21 by ion implantation. The defect portions D2 in the current diffusion layer 17 are formed with the p-type impurities, when the base layer 21 is formed by ion implantation, entering the current diffusion layer 17.

Figure 16:
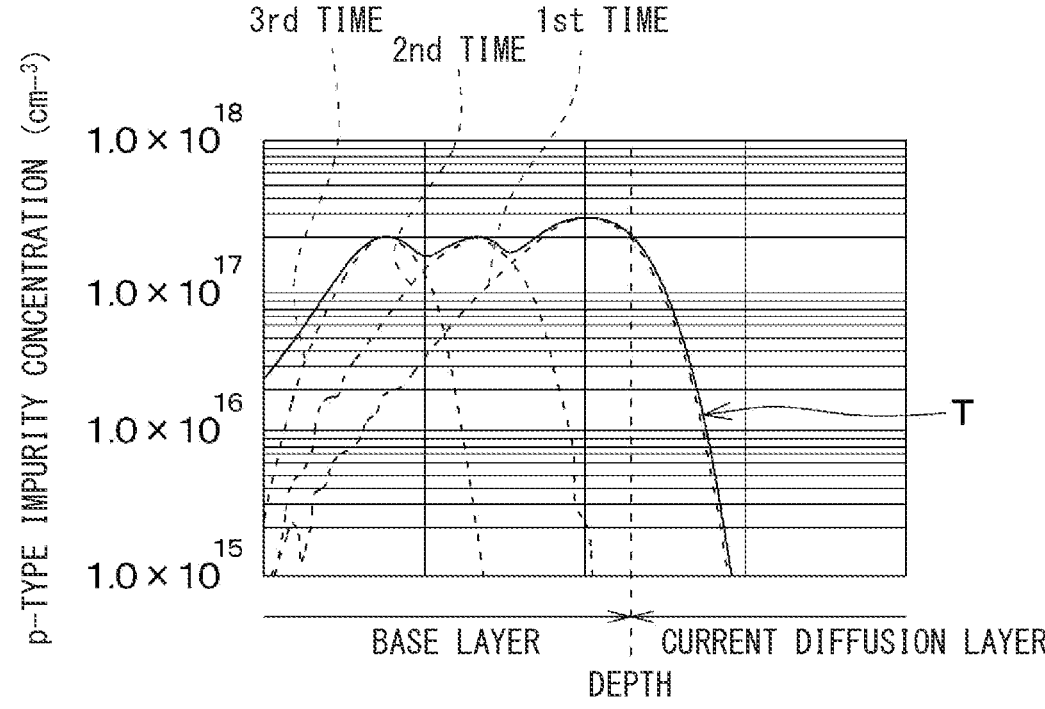
FIG. 16 is a graph showing a relationship between a depth and a p-type impurity concentration.

Specifically, the base layer 21 and the current diffusion layer 17 are formed such that, in a p-type impurity concentration distribution, p-type impurities are also present in the current diffusion layer 17, as shown in FIG. 16. In other words, the base layer 21 and the current diffusion layer 17 are formed such that a tail portion T in the p-type impurity concentration distribution is located in the current diffusion layer 17. The tail portion T in the impurity concentration distribution means a portion on the other surface 10b side in the depth direction. The base layer 21 and the current diffusion layer 17 as described above are formed by performing ion implantation multiple times while changing an acceleration voltage to form the base layer 21 and causing the p-type impurities, when the base layer 21 is formed, to enter the current diffusion layer 17. FIG. 16 shows a graph in a case where the ion implantation is performed three times while changing an acceleration voltage.

In addition, the base layer 21 and the current diffusion layer 17 of the present embodiment are formed such that, in order that the defect portions D2 are sufficiently formed in the current diffusion layer 17, a portion having a p-type impurity concentration of $1.0\times10^{15}/cm^3$ or more is included in the current diffusion layer 17. According to the study by the present inventors, it has been confirmed that, in a case where the current diffusion layer 17 is configured to have a portion having a p-type impurity concentration of $1.0\times10^{15}/cm^3$ or more, the defect portions D2 are sufficiently formed.

The configuration of the SiC semiconductor device S1 of the present embodiment has been described above. Next, a method for forming the defect portions D1 in the base layer 21 and the defect portions D2 in the current diffusion layer 17, in the SiC semiconductor device S1, will be described with reference to FIGS. 17A and 17B.

First, an object, in which the substrate 11, the buffer layer 12, the low-concentration layer 13, the JFET portion 14, the first deep layer 15, the current diffusion layer 17, and the second deep layer 18 are formed, is prepared as illustrated in FIG. 17A. Then, a base layer-forming layer 210 to form the base layer 21 is disposed as an epitaxial layer epitaxially grown on the current diffusion layer 17 and the second deep layer 18. In the present embodiment, the base layer-forming layer 210 is formed by epitaxial growth so as to have an impurity concentration smaller by one digit or more than the impurity concentration when the base layer 21 is formed by performing the ion implantation to be described later. This makes it possible to suppress an in-plane variation in impurity concentration as compared with a case where the base layer 21 having a desired impurity concentration is formed by epitaxial growth. Note that the base layer-forming layer 210 of the present embodiment is designed to have a thickness equal to the base layer 21. The thickness of the base layer-forming layer 210, however, may be designed to be equal to the sum of the thickness of the base layer 21 and the thickness of the source region 22.

Next, the base layer 21 is formed by performing ion implantation multiple times while changing an acceleration voltage, as illustrated in FIG. 17B. When the base layer 21 is formed, ion implantation is performed while changing an acceleration voltage such that a portion having a p-type impurity concentration of $1.5 \times 10^{15}/cm^3$ is included in the current diffusion layer 17, as shown in FIG. 16, thereby forming the base layer 21. Note that FIG. 16 shows a graph in a case where the ion implantation is performed three times while changing an acceleration voltage. As a result, the defect portions D1 are formed in the base layer 21, and the defect portions D2 are formed in the current diffusion layer 17.

The defect portions D in the JFET portion 14 are formed by performing ion implantation, as described above. The defect portions D1 in the base layer 21 and the defect portions D2 in the current diffusion layer 17 are formed by performing ion implantation. Here, it has been reported that, in a case where ion implantation is performed on SiC, defect portions are less likely to be generated when the ion implantation is performed at a high temperature. Therefore, in the present embodiment, ion implantation is performed at a temperature at which larger amounts of the defect portions D, D1, and D2 are formed than defect portions that can be generated when the low-concentration layer 13 for forming the JFET portion 14 and the base layer-forming layer 210 are epitaxially grown and disposed. Specifically, in the present embodiment, the temperature, at which each ion implantation is performed, is designed to be a temperature from room temperature to 200° C. or lower. As a result, it is possible to suppress that each of the defect portions D, D1, and D2 may not be formed at the time of the ion implantation. According to the study by the present inventors, it has been confirmed that each of the defect portions D, D1, and D2 are appropriately formed by performing ion implantation at a temperature of 200° C. or lower. The room temperature in the present embodiment means a temperature of about 1 to 30° C.

Although not particularly illustrated, the source region 22, the contact region 23, the trench gate structure, and the like are thereafter formed, thereby manufacturing the SiC semiconductor device S1.

According to the present embodiment described above, the defect portions D are formed in the JFET portion 14, so that the same effects as those of the first embodiment can be obtained.

(1) In the present embodiment, the defect portions D1 are formed in the base layer 21, and the defect portions D2 are formed in the current diffusion layer 17. Therefore, the number of portions to be the defect portions D1 and D2 increases in the path through which the hole current flows, and holes can be trapped in portions, other than the defect portions D, of the JFET portion 14, so that it is possible to further suppress holes from reaching the BPD.

(2) In the present embodiment, the current diffusion layer 17 is configured to have a portion having a p-type impurity concentration of $1.0 \times 10^{15}/cm^3$ or more. Therefore, the defect portions D2 caused by p-type impurities can be easily formed in the current diffusion layer 17.

(3) In the present embodiment, the base layer 21 is formed by performing ion implantation multiple times. Therefore, the current diffusion layer 17, having a portion having a p-type impurity concentration of $1.0 \times 10^{15}/cm^3$ or more, can be easily formed. In addition, the base layer 21 is formed by performing ion implantation multiple times, so that it is possible to suppress a variation in the impurity concentration distribution in the depth direction in the base layer 21 as compared with a case where the base layer 21 is formed by, for example, one time of ion implantation. Therefore, it is also possible to suppress a fluctuation in a threshold voltage to the gate electrode 26 necessary for turning on the SiC semiconductor.

(4) In the present embodiment, when the base layer-forming layer 210 is formed, the impurity concentration is designed to be smaller by one digit or more than the impurity concentration in the base layer 21. This makes it possible to suppress an in-plane variation in impurity concentration as compared with a case where the base layer 21 having a desired impurity concentration is formed by epitaxial growth.

(5) In the present embodiment, the ion implantation is performed at a temperature of 200° C. or lower. Therefore, it is possible to suppress that each of the defect portions D, D1, and D2 may not be appropriately formed at the time of the ion implantation.

Other Embodiments

Although the present disclosure has been described in accordance with the embodiments, it is understood that the present disclosure is not limited to the embodiments and structures. The present disclosure also encompasses various modifications and variations within the scope of equivalents. In addition, various combinations and modes, and other combinations and modes including only one element, more elements, or less elements are also within the scope and idea of the present disclosure.

For example, in each of the above embodiments, an example has been described in which the first conductivity type is an n-type and the second conductivity type is a p-type, but the first conductivity type may be a p-type and the second conductivity type may be an n-type.

In each of the above embodiments, the defect portions D may be formed inside at least one of the first deep layer 15 and the second deep layer 18. That is, it may be designed such that the number of portions to be the defect portions D increases in the path through which the hole current flows. In this case, for example, in a case where the defect portions D are formed in the first deep layer 15, the first deep layer 15 may be formed by ion implantation or the like such that the defect portions D are formed in the first deep layer 15. According to this, holes can be trapped even in a portion, other than the defect portions D, of the JFET portion 14, so that it is possible to further suppress holes from reaching the BPD.

Furthermore, in each of the above embodiments, the defect portions D may not be formed by ion implantation. It may be designed such that, after the JFET portion 14 is formed by epitaxial growth or the like, the defect portions D are formed by, for example, irradiating the JFET portion with electron beams such as helium. In addition, in a case where the JFET portion 14 is formed by epitaxial growth or the like, it may be designed such that the defect portions D are formed by mixing p-type impurities, such as boron, gallium, or aluminum, and increasing the total amount of impurities. That is, it may be designed such that the defect portions D are formed simultaneously when an epitaxial film is formed, instead of ion implantation or irradiation with electron beams or the like. Note that, in a case where the defect portions D are formed by mixing p-type impurities in this manner, it is preferable to adjust the total amount of n-type impurities such that the impurity concentration in the entire JFET portion 14 does not become too low. In addition, in a case where the JFET portion 14 is formed by epitaxial growth, it may be designed such that impurities, having a hole capture rate higher than an electron capture rate, such as vanadium, titanium, or iron, may be mixed. According to this, it is possible to further suppress holes from being discharged from the JFET portion 14.

In a case where the defect portions D are formed in the JFET portion 14 while the JFET portion 14 is formed by epitaxial growth, the first deep layer 15 is formed as follows. That is, the first deep layer 15 is formed by forming the JFET portion 14 on the entire low-concentration layer 13 in the cell section 1 and then performing ion implantation or the like on a predetermined portion of the JFET portion 14. In this case, the defect portions D are formed in the JFET portion 14 disposed on the entire low-concentration layer 13, and thus a state is created in which the defect portions D are also formed in the first deep layer 15. Therefore, it is also possible to suppress holes from being discharged from the first deep layer 15.

In each of the above embodiments, the cell section 1 may be configured to have the same forward voltage as the outer peripheral section 2 at the time of reverse conduction. In each of the above embodiments, it may be designed such that the JFET portion 14 and the first deep layer 15 have the same thickness. That is, the JFET portion 14 may not be disposed between the first deep layer 15 and the low-concentration layer 13. In each of the above embodiments, the impurity concentrations in the JFET portion 14 and the like, the impurity concentration in the base layer 21, the width L1 of the first deep layer 15, and the like may be appropriately changed. Since the defect portions D are formed in the JFET portion 14 even in such a SiC semiconductor device S1, it is possible to suppress the BPD from expanding to the SF and to suppress an increase in the on-voltage.

What is claimed is:

1. A silicon carbide semiconductor device having a switching element of a MOS structure having a trench gate structure, the silicon carbide semiconductor device comprising:
    a cell section having the switching element; and
    an outer peripheral section surrounding the cell section,
    wherein the cell section includes:
        a substrate of a first conductivity type made of silicon carbide;
        a buffer layer of the first conductivity type disposed on the substrate and having an impurity concentration lower than that of the substrate;
        a low-concentration layer of the first conductivity type disposed on the buffer layer and having an impurity concentration lower than that of the substrate;
        a first deep layer of a second conductivity type disposed on the low-concentration layer and having a plurality of linear portions whose longitudinal directions are one direction along a planar direction of the substrate;
        a JFET portion of the first conductivity type disposed on the low-concentration layer and having a linear portion sandwiched between the linear portions of the first deep layer;
        a current diffusion layer of the first conductivity type disposed on the JFET portion and having an impurity concentration higher than that of the low-concentration layer;
        a second deep layer of the second conductivity type disposed on the first deep layer;
        a base layer of the second conductivity type disposed on the current diffusion layer and the second deep layer;
        an impurity region of the first conductivity type disposed in a surface layer portion of the base layer;
        the trench gate structure having a gate insulating film disposed on a wall surface of a trench that penetrates the impurity region and the base layer to reach the current diffusion layer, and a gate electrode disposed on the gate insulating film;
        a first electrode electrically connected to the impurity region and the base layer; and
        a second electrode electrically connected to the substrate, and wherein the JFET portion is formed with defect portions.

2. The silicon carbide semiconductor device according to claim 1, wherein
    the cell section is configured such that, when the switching element is in a reverse conducting state, a forward voltage is set to be lower than the outer peripheral section.

3. The silicon carbide semiconductor device according to claim 1, wherein
    the JFET portion is also disposed between the first deep layer and the low-concentration layer.

4. The silicon carbide semiconductor device according to claim 1, wherein
    the JFET portion is provided by an ion-implanted layer and has an impurity concentration of $7.0 \times 10^{16}$ to $5.0 \times 10^{17}/cm^3$.

5. The silicon carbide semiconductor device according to claim 1, wherein
    a portion of the base layer in contact with the trench has a length of 0.4 $\mu$m or less in a stacking direction of the substrate and the buffer layer.

6. The silicon carbide semiconductor device according to claim 1, wherein
    the base layer has an impurity concentration of $3.0 \times 10^{17}/cm^3$ or less.

7. The silicon carbide semiconductor device according to claim 1, wherein
    the first deep layer has a width of 0.9 $\mu$m or less in a direction intersecting with the longitudinal direction and along the planar direction of the substrate.

8. The silicon carbide semiconductor device according to claim 7, wherein
    the first deep layer is extended from the cell section to the outer peripheral section.

9. The silicon carbide semiconductor device according to claim 1, wherein a distance between centers of a plurality of trenches adjacent to each other is 3.0 μm or less.

10. The silicon carbide semiconductor device according to claim 1, wherein an interval between the linear portions of the first deep layer adjacent to each other is 0.75 to 1.1 μm.

11. The silicon carbide semiconductor device according to claim 1, wherein at least one of the base layer, the first deep layer, and the second deep layer is formed with the defect portions.

12. The silicon carbide semiconductor device according to claim 11, wherein the base layer is formed with the defect portions, and the current diffusion layer includes impurities of the second conductivity type and is formed with the defect portions.

13. The silicon carbide semiconductor device according to claim 12, wherein the current diffusion layer has a portion having a second conductivity type impurity concentration of $1.0 \times 10^{15}/cm^3$ or more.

14. An inverter circuit having an arm in which a MOSFET and a freewheeling diode are connected in parallel, the inverter circuit comprising the silicon carbide semiconductor device according to claim 1, wherein the MOSFET is provided by the switching element, and the freewheeling diode is provided by a parasitic diode formed in the switching element.

15. A method for manufacturing a silicon carbide semiconductor device, the silicon carbide semiconductor device having: a cell section in which a switching element having a MOS structure is formed; and an outer peripheral section surrounding the cell section, in which the cell section includes:

a substrate of a first conductivity type made of silicon carbide;

a buffer layer of the first conductivity type formed on the substrate and having an impurity concentration lower than the substrate;

a low-concentration layer of the first conductivity type formed on the buffer layer and having an impurity concentration lower than the substrate;

a first deep layer of a second conductivity type formed on the low-concentration layer and having a plurality of linear portions whose longitudinal directions are one direction in a planar direction of the substrate;

a JFET portion of the first conductivity type disposed on the low-concentration layer and having a linear portion sandwiched between the linear portions of the first deep layer;

a current diffusion layer of the first conductivity type disposed on the JFET portion and having an impurity concentration higher than the low-concentration layer;

a second deep layer of the second conductivity type disposed on the first deep layer;

a base layer of the second conductivity type disposed on the current diffusion layer and the second deep layer;

an impurity region of the first conductivity type formed in a surface layer portion of the base layer;

a trench gate structure having a gate insulating film formed on a wall surface of a trench that penetrates the impurity region and the base layer to reach the current diffusion layer, and a gate electrode formed on the gate insulating film;

a first electrode electrically connected to the impurity region and the base layer; and a second electrode electrically connected to the substrate, and the JFET portion is formed with defect portions, the method comprising:

disposing the low-concentration layer as an epitaxial layer;

forming the JFET portion by performing ion implantation on a surface layer portion of the low-concentration layer; and forming the defect portions in the JFET portion by performing the ion implantation.

16. The method for manufacturing the silicon carbide semiconductor device according to claim 15, comprising:

disposing a base layer-forming layer that forms the base layer, on the current diffusion layer as an epitaxial layer;

performing ion implantation on the base layer-forming layer multiple times while changing an acceleration voltage in order to form the base layer and form defect portions in the base layer; and causing impurities, when the base layer is formed, to enter the current diffusion layer in order to further form defect portions in the current diffusion layer.

17. The method for manufacturing the silicon carbide semiconductor device according to claim 16, wherein in the disposing the base layer-forming layer, the base layer-forming layer, having an impurity concentration smaller by one digit or more than the impurity concentration when the base layer is formed, is disposed.

18. The method for manufacturing the silicon carbide semiconductor device according to claim 15, wherein in the forming of the defect portion in the JFET portion, the ion implantation is performed at a temperature at which a larger amount of the defect portions is formed than defect portions that can be generated when in the disposing of the low concentration layer as the epitaxial layer.

* * * * *